US009018717B2

(12) United States Patent
Knipe et al.

(10) Patent No.: US 9,018,717 B2
(45) Date of Patent: Apr. 28, 2015

(54) PULL UP ELECTRODE AND WAFFLE TYPE MICROSTRUCTURE

(75) Inventors: Richard L. Knipe, McKinney, TX (US); Robertus Petrus van Kampen, S-Hertogenbosch (NL); Anartz Unamuno, Roermond (NL); Roberto Gaddi, S-Hertogenbosch (NL)

(73) Assignee: Cavendish Kinetics, Ltd., San Jose, CA (US)

( * ) Notice: Subject to any disclaimer, the term of this patent is extended or adjusted under 35 U.S.C. 154(b) by 274 days.

(21) Appl. No.: 13/237,261

(22) Filed: Sep. 20, 2011

(65) Prior Publication Data

US 2012/0068278 A1 Mar. 22, 2012

Related U.S. Application Data

(60) Provisional application No. 61/384,840, filed on Sep. 21, 2010.

(51) Int. Cl.

*H01L 41/02* (2006.01)
*H01H 1/00* (2006.01)
*H01H 59/00* (2006.01)

(52) U.S. Cl.

CPC ......... *H01H 1/0036* (2013.01); *H01H 59/0009* (2013.01); *H01H 2001/0084* (2013.01)

(58) Field of Classification Search

CPC ............. H01H 1/0036; H01H 59/0009; H01L 41/094; H01L 41/1136; H01L 41/096; H01L 41/0966; H01L 41/0953

USPC ......................................... 257/414, 417–419

See application file for complete search history.

(56) References Cited

U.S. PATENT DOCUMENTS

| | | | | |
|---|---|---|---|---|
| 5,917,226 | A | 6/1999 | Chan et al. | |
| 6,469,603 | B1 | 10/2002 | Ruan et al. | |
| 7,352,607 | B2 | 4/2008 | Furukawa et al. | |
| 7,586,387 | B2 | 9/2009 | Van Delden | |
| 8,736,404 | B2 * | 5/2014 | Knipe et al. | 335/78 |
| 2003/0042117 | A1 | 3/2003 | Ma | |
| 2006/0061389 | A1 | 3/2006 | Bertin | |
| 2007/0004096 | A1 | 1/2007 | Heuvelman | |
| 2007/0236307 | A1 | 10/2007 | Liu | |
| 2009/0046018 | A1 * | 2/2009 | Lee et al. | 343/700 R |
| 2009/0207717 | A1 | 8/2009 | van Kampen | |
| 2010/0116632 | A1 | 5/2010 | Smith et al. | |
| 2010/0181631 | A1 | 7/2010 | Lacey | |

FOREIGN PATENT DOCUMENTS

EP 2144265 A1 1/2010

OTHER PUBLICATIONS

International search report and written opinion for PCT/US2011/052118 dated Dec. 12, 2011.

* cited by examiner

*Primary Examiner* — Jose R Diaz
(74) *Attorney, Agent, or Firm* — Patterson & Sheridan, LLP

(57) ABSTRACT

The present invention generally relates to MEMS devices and methods for their manufacture. The cantilever of the MEMS device may have a waffle-type microstructure. The waffle-type microstructure utilizes the support beams to impart stiffness to the microstructure while permitting the support beam to flex. The waffle-type microstructure permits design of rigid structures in combination with flexible supports. Additionally, compound springs may be used to create very stiff springs to improve hot-switch performance of MEMS devices. To permit the MEMS devices to utilize higher RF voltages, a pull up electrode may be positioned above the cantilever to help pull the cantilever away from the contact electrode.

12 Claims, 9 Drawing Sheets

Figure 2A
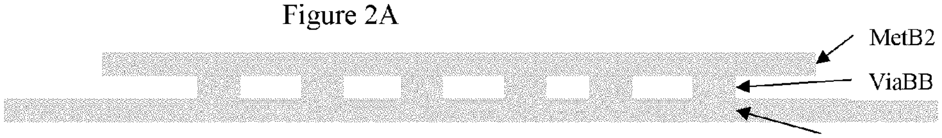
Figure 2B
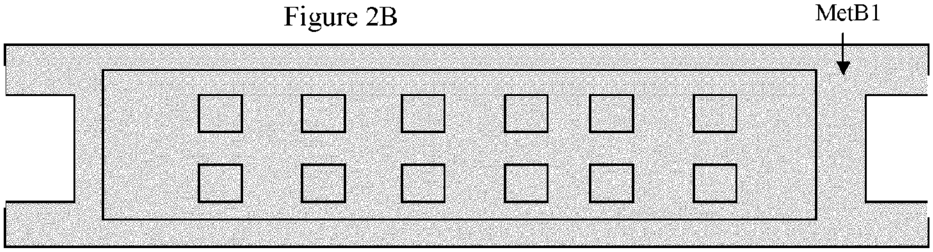
Figure 3A
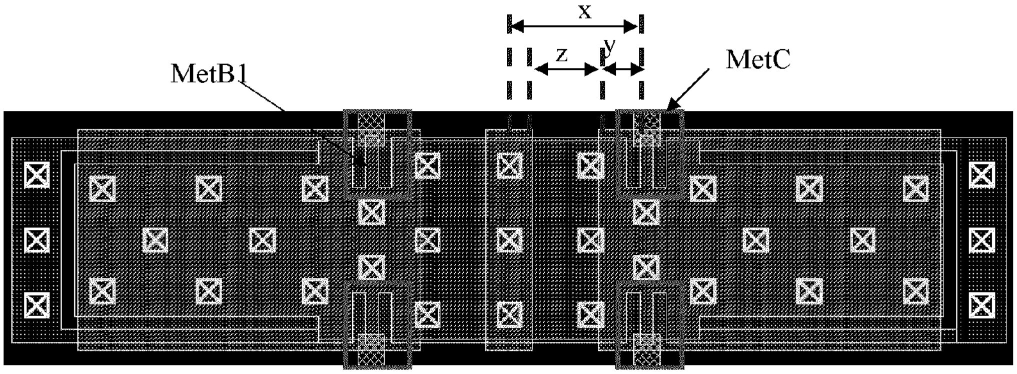
Figure 3B

PULL UP ELECTRODE AND WAFFLE TYPE MICROSTRUCTURE

CROSS-REFERENCE TO RELATED APPLICATIONS

This application claims benefit of U.S. Provisional Patent Application Ser. No. 61/384,840 (CK066), filed Sep. 21, 2010, which is herein incorporated by reference.

BACKGROUND OF THE INVENTION

1. Field of the Invention

Embodiments of the present invention generally relate to a micro-electromechanical (MEMS) device and a method for its fabrication.

2. Description of the Related Art

As the size of semiconductors continues to shrink, so does the MEMS devices that are coupled to the semiconductors. MEMS devices may be used as miniature relay switches, capacitance switches, non-volatile memory elements and for many more applications. The MEMS devices have a switch or cantilever that moves between at least two positions to either permit or deny a current from flowing through the switch. The cantilever may be clamped at one or both ends.

MEMS devices are made using similar processing steps to those found in semiconductor foundries and therefore can be manufactured cost effectively on a wafer scale. One of the issues found in shrinking MEMS devices to the scale of less than a few micrometers is the ability of the switch or cantilever to be pulled into contact with an electrode and then released back to its original state. Due to the scale of the MEMS device, the cantilever or switch may not have enough restoring force to permit the switch or cantilever to return to its original state. The MEMS device performance will thus be negatively impacted.

Therefore, there is a need in the art for a MEMS device that is resilient enough to be pulled or pushed into contact with an electrode and then released back to its original position. There is also a need in the art for a method to manufacture such a device.

SUMMARY OF THE INVENTION

The present invention generally relates to MEMS devices and methods for their manufacture. The cantilever of the MEMS device may have a waffle-type microstructure. The waffle-type microstructure utilizes the support beams to impart stiffness to the microstructure while permitting the support beam to flex. The waffle-type microstructure permits design of rigid structures in combination with flexible supports. Additionally, compound springs may be used to create very stiff springs to improve hot-switch performance of MEMS devices. To permit the MEMS devices to utilize higher RF voltages, a pull up electrode may be positioned above the cantilever to help pull the cantilever away from the contact electrode.

In one embodiment, a method of producing a micro-electromechanical device is disclosed. The method includes depositing a first sacrificial layer over a dielectric layer, depositing a first structural layer over the first sacrificial layer, and depositing a second sacrificial layer over the first structural layer. The method also includes etching one or more first vias through the second sacrificial layer to expose at least a portion of the first structural layer. Additionally, a second structural layer is deposited within the one or more first vias and over the second sacrificial layer. The method also includes depositing a third sacrificial layer over the second structural layer. The method additionally includes etching the first sacrificial layer, the second sacrificial layer and the third sacrificial layer to free the first structural layer and the second structural layer within a cavity and form the micro-electromechanical device. The now freed micro-electromechanical device is able to move in response to voltages applied to electrodes.

In another embodiment, a micro-electromechanical device is disclosed. The device includes a first structural layer coupled to a plurality of first electrodes and a second structural layer spaced from the first structural layer to define a space between the first structural layer and the second structural layer. The device also includes a plurality of posts disposed within the space and coupled between the first structural layer and the second structural layer, each of the plurality posts spaced from an adjacent post.

In another embodiment, a micro-electromechanical device is disclosed. The device includes a first structural layer coupled to one or more first electrodes and a second structural layer spaced from the first structural layer to define a space between the first structural layer and the second structural layer. The device also includes a plurality of posts disposed within the space and coupled between the first structural layer and the second structural layer. Each of the plurality posts are spaced from an adjacent post. The first structural layer, second structural layer, and plurality of posts collectively form a cantilever or suspended structure such as a bridge that is disposed within a cavity. The device also includes one or more compound springs that may or may not be electrically conductive. The one or more compound springs may be connected to the cantilever or suspended structure and disposed within the cavity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A and 2B show a waffle-type cantilever according to one embodiment.

FIGS. 3A-3F show waffle-type MEMS devices that utilize compound spring technology.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
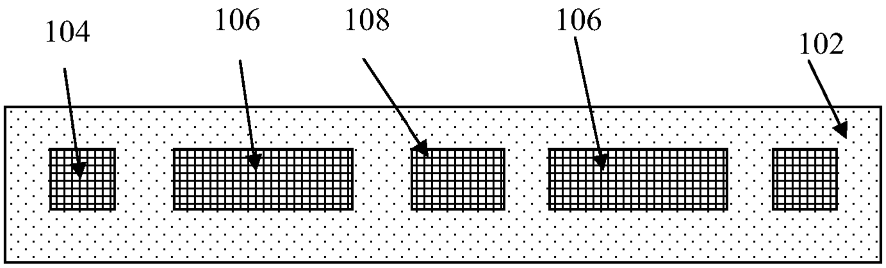
FIGS. 1A-1L show a MEMS device at various stages of manufacture.
Figure 1B:
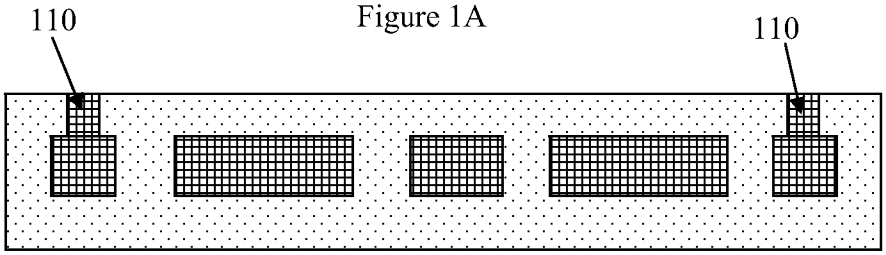
Figure 1C:
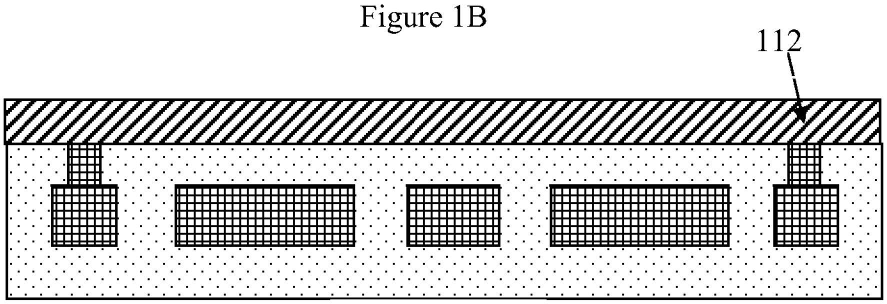
Figure 1D:
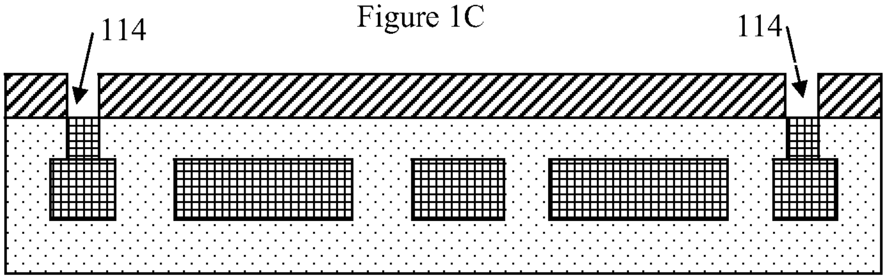
Figure 1E:
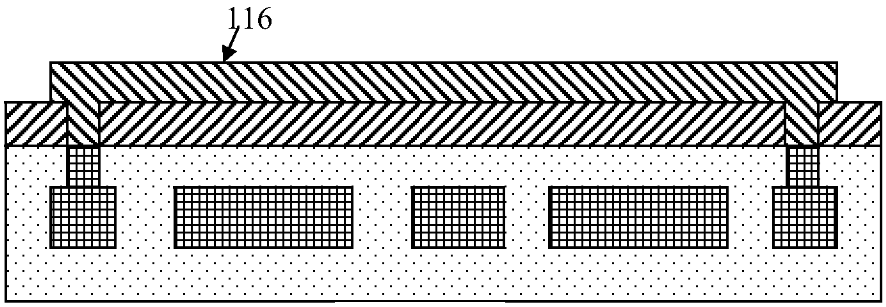
Figure 1F:
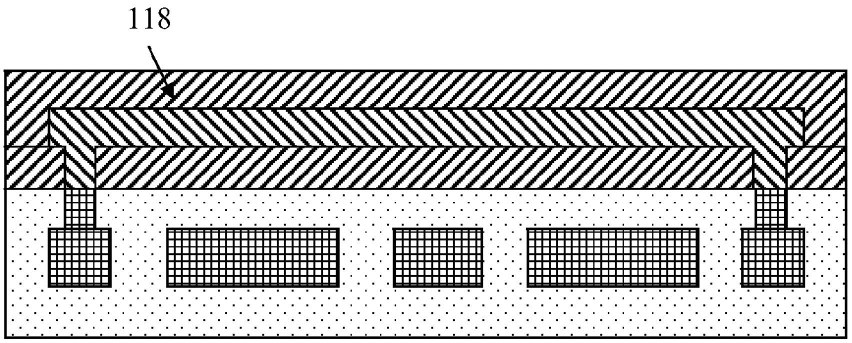
Figure 1G:
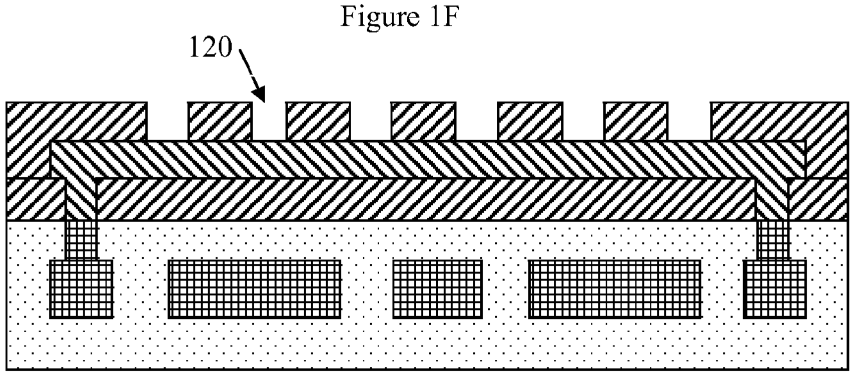
Figure 1H:
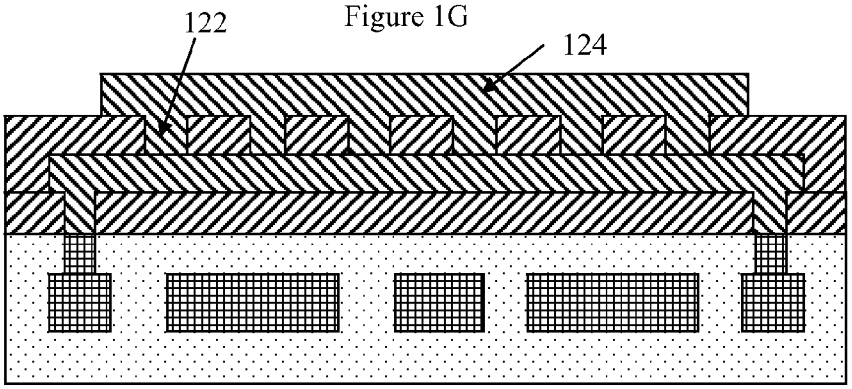
Figure 1I:
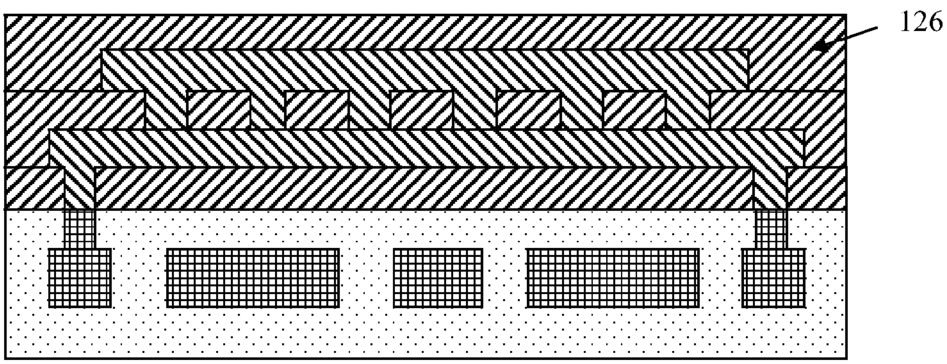
Figure 1J:
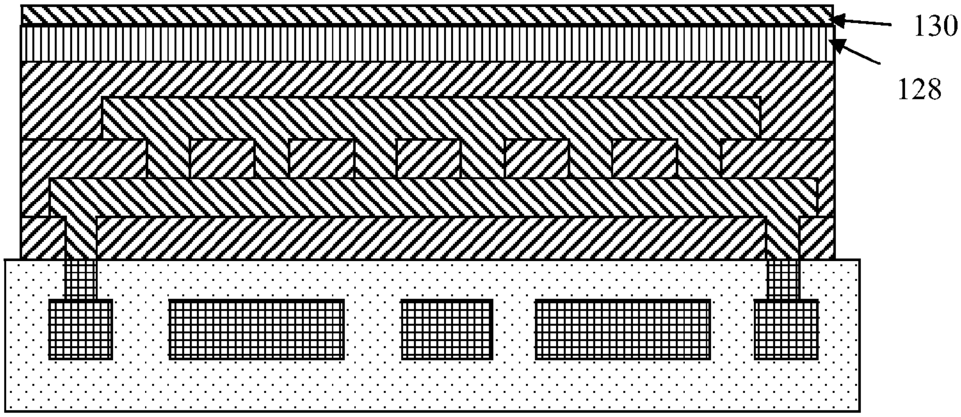
Figure 1K:
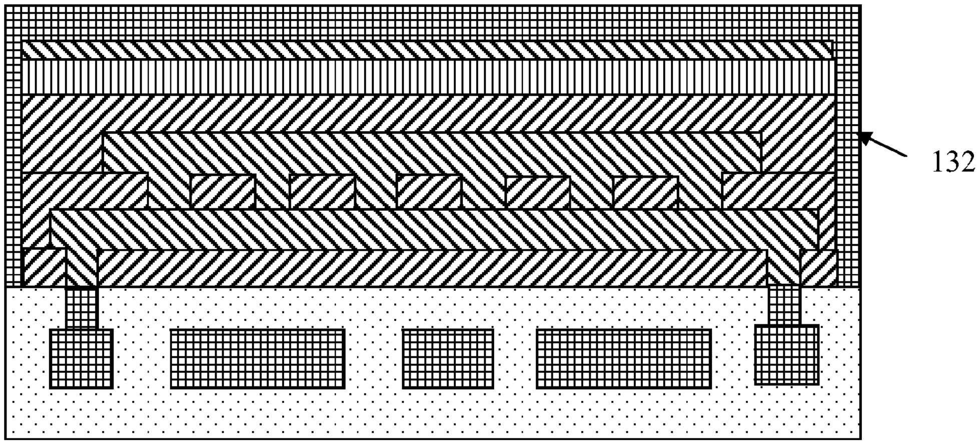
Figure 1L:
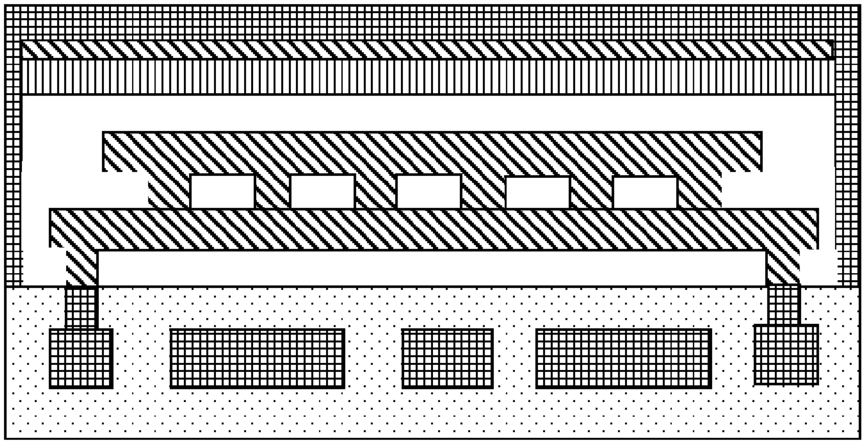

The present invention generally relates to MEMS devices and methods for their manufacture. The cantilever of the MEMS device may have a waffle-type microstructure. The waffle-type microstructure utilizes the support beams to impart stiffness to the microstructure while permitting the support beam to flex. The waffle-type microstructure permits design of rigid structures in combination with flexible supports. Additionally, compound springs may be used to create very stiff springs to improve hot-switch performance of MEMS devices. To permit the MEMS devices to utilize higher RF voltages, one or more pull up electrode may be positioned above the cantilever to help pull the cantilever away from the contact electrode.

The waffle type structure discussed herein allows decoupling of the spring stiffness from the plate stiffness, providing a method to design rigid structures in combination with flexible supports. The waffle-type structure also allows the addition of compound springs that could be used to create very stiff springs to improve hot-switch performance of MEMS variable capacitors.

Due to the exponential increase of data transfer in mobile communications, soon it will be required to increase the capacity of the data handling. The use of tuneable components such as a MEMS Digital Variable Capacitor (DVC) could provide ways to increase data transfer capacity by allowing the resonant frequency of the aerial and digital DVC circuit to be matched to the incoming signal.

The performance of a MEMS DVC is mainly characterised by the RF specs, such as tuning ratio (i.e., ratio of the high capacitance down state of the cantilever to the low capacitance up state of the cantilever), quality factor (i.e., the ratio of the imaginary and the real part of the admittance), linearity (i.e., the amount of distortion of the output signal relative to the input signal as the power level is increased), etc. It is to be understood that while the description will be made utilizing the term "cantilever", the term "cantilever" is meant to cover devices that are cantilevers as well as suspended structures such as bridges or movable structures that are anchored or clamped at the ends, yet movable in the middle. The DVCs also have operating specs, such as actuation voltage (i.e., the voltage required to pull the cantilever down to the high capacitance state), hot-switch voltage (i.e., the voltage on the RF electrode that will hold down the capacitor in the high capacitance state when the actuation voltage is just reduced to zero), capacitance density (i.e., the capacitance per unit area), self-program and self-erase voltage, etc. The ideal specification of a DVC includes low actuation voltage (i.e., voltage required to pull the MEMS cantilever down to the high capacitance state) and high hot-switch voltage. These two components of the ideal specification are generally opposing each other. The lower the actuation voltage, the lower the hot-switch voltage will be, because to get a low actuation voltage the spring constant of the MEMS cantilever needs to be low. To get a high hot switching voltage, a large spring constant is needed to pull the two RF plates apart when a large RF voltage is applied as the RF frequency is faster than the cantilever reaction time. This RF signal provides an average pull-in force. The pull in force can be increased for a given pull in voltage and gap by increasing the device area, but this adds to cost and is undesirable.

The methods presented here show methods of decoupling the stiffness of the support beams from the plate stiffness, therefore, obtaining low actuation voltages and being able to achieve higher hot-switch voltages for small area devices, as well as providing better stress control, a reduction in the complication of certain process steps and improved RF performance (e.g., linearity). It also allows us to stiffen parts of the beam without increasing the mass as much as would occur if the beam was just to be made thicker in those parts.

FIGS. 1A-1L show a MEMS device at various stages of manufacture. The device includes a dielectric layer 102 that may be formed within a semiconductor device such as the back end of the line (BEOL) of a complementary metal oxide semiconductor (CMOS) structure. Embedded within the dielectric layer 102 are one or more first electrodes 104 that are the metallization track that will make contact with the cantilever of the MEMS device. One or more pull-in electrodes 106 may also be embedded within the dielectric layer 102. The pull-in electrodes 106 may function to pull the cantilever into contact with the dielectric layer 102. Also embedded within the dielectric layer 102 is an RF electrode 108.

One or more vias may be etched into the dielectric layer 102 to expose the one or more first electrodes 104. The vias may then be filled with electrically conductive material 110 that is used to make an electrical connection between the one or more first electrodes 104 and the cantilever structure. In one embodiment, the electrically conductive material 110 may comprise a metal. In another embodiment, the electrically conductive material 110 may comprise a material selected from the group consisting of titanium, tantalum, titanium nitride, tantalum nitride, copper, aluminum, and combinations thereof.

A first sacrificial layer 112 is then deposited over the dielectric layer 102. The first sacrificial layer 112 is used to define the spacing between the upper surface of the dielectric layer 102 and the bottom surface of the cantilever. The first sacrificial layer 112 may be deposited by a process such as plasma enhanced chemical vapour deposition (PECVD), chemical vapour deposition (CVD), spin-on technologies, and physical vapour deposition (PVD) to name a few. In one embodiment, the first sacrificial layer 112 may comprise a silicon containing compound. In another embodiment, the first sacrificial layer 112 may comprise silicon dioxide. In another embodiment, the first sacrificial layer 112 may comprise spin-on glass or spin on dielectric containing a long chain molecule with a carbon backbone. Such a material would need to have a low silicon content, because the sacrificial etch to remove carbon based compounds often leaves residues if they contain silicon.

One or more vias 114 are then etched through the first sacrificial layer 112 to expose the underlying electrically conductive material 110. In one embodiment, the dielectric layer 102 may be etched after the one or more vias 114 are formed. In any event, the one or more vias 114 are then filled with the material used to form the first structural layer 116. The filled vias 114 provide the electrical connection between the electrodes 104 and the cantilever. The first structural layer 116 will be the bottom portion of the cantilever once the device is formed. In one embodiment, the first structural layer 116 may comprise a metal. In another embodiment, the first structural layer 116 may comprise a material selected from the group consisting of titanium, tantalum, titanium nitride, tantalum nitride, copper, aluminum, and combinations thereof. In another embodiment, the structural layer 116 may comprise a multi-layer structure. For example, a 5-layer stack (TiN—Al—Tin—Al—TiN) may be utilized. Each titanium nitride layer may have a thickness of less than 100 nm to avoid issues with TiN grains. Other materials that may be used in a multi-layer structure include TiAl and TiAlN. In another embodiment the structural layer 116 may consist of a tri layer structure such as TiN then Al then TiN. The tri-layer structure combines the strength advantages of TiN which has a high resistivity with the low resistance properties of Al which has poor mechanical strength. By sandwiching a thin Al layer between two TiN layers any residual stress difference in the deposition of the two materials will not cause differential stress in the MEMS structure. In addition, differences in the thermal expansions between the two materials will not cause differential stress in a symmetric TiN—Al—TiN sandwich layer. An additional advantage of such a structure is that the mechanical strength of TiN films is reduced at greater thickness of film. This is because of increased voids at increasing deposition thicknesses. By stopping the deposition of the TiN at around 200 nm putting down a thin Al layer and commencing growth, this problem can be greatly reduced. The first structural layer 116 may then be etched to form the final shape of the first structural layer 116. The first structural layer 116 may be deposited by well known techniques such as sputtering, electroless plating and electrochemical plating.

A second sacrificial layer 118 is then deposited over the first structural layer 116. Similar to the first sacrificial layer 112, the second sacrificial layer 118 may be deposited by a process such as PECVD, CVD, spin-on technologies, and PVD. In one embodiment, the second sacrificial layer 118 may comprise a silicon containing compound. In another embodiment, the second sacrificial layer 118 may comprise silicon dioxide. In another embodiment, the second sacrificial layer 118 may comprise spin-on glass or spin on dielectric containing a long chain carbon molecule and with a low silicon content as discussed above. A plurality of vias 120 are then etched through the second sacrificial layer 118 to expose at least a portion of the underlying first structural layer 116. The second sacrificial layer 118 is used to provide a spacing between the first structural layer 112 and the second structural layer 124. Electrically conductive material is deposited into the vias 120 to form posts 122. The posts 122 are used to provide a connection between the first structural layer 112 and the second structural layer 124. The second structural layer 124 is then deposited over the posts 122 and the second sacrificial layer 118. The first structural layer 112, the posts 122 and the second structural layer 124 collectively form the waffle-type structure once all of the sacrificial material as been removed to free the device. Similar to the first structural layer 116, the posts 122 and second structural layer 124 may comprise a metal. In another embodiment, the second structural layer 124 and posts 122 may comprise a material selected from the group consisting of titanium, tantalum, titanium nitride, tantalum nitride, copper, aluminum, and combinations thereof. The second structural layer 124 and posts 122 may be deposited by well known techniques such as sputtering, electroless plating and electrochemical plating. To simplify the number of process steps after the second sacrificial layer 118 has been exposed and via holes etched into it, the second structural layer 124 may be added during the formation of the posts 122. The second structural layer then forms a continuous film over the second sacrificial layer 118 that makes mechanical contact with the first structural layer 116.

A third sacrificial layer 126 is then deposited over the second structural layer 124. The third sacrificial layer 126 is used to provide a spacing between the top of the device, which in this embodiment is the second structural layer 12, and the pull-up electrode 130. Similar to the first and second sacrificial layers 112, 118, the third sacrificial layer 126 may be deposited by a process such as PECVD, CVD, spin-on technologies, and PVD. In one embodiment, the third sacrificial layer 126 may comprise a silicon containing compound. In another embodiment, the third sacrificial layer 126 may comprise silicon dioxide. In another embodiment, the third sacrificial layer 126 may comprise spin-on glass or spin on dielectric. Because many spin-on dielectrics have a large thermal expansion coefficient, during curing of the spin on material it is important to cure the lower sacrificial layers at a higher temperature than the higher layers. This reduces the possibility that annealing the top sacrificial layers will cause thermal expansion of the lower sacrificial layer to such an extent that they cause damage to the intervening mechanical cantilever layers.

In one embodiment, a pull-up electrode 130 is then formed over the third sacrificial layer 126 on top of an insulating layer 128. The pull-up electrode 130 may be used to pull the cantilever away from the bottom of the cavity and up to the insulating layer 128. The insulating layer 128 is there to prevent the top layer 124 of the grounded cantilever from shorting to the pull up electrode 130. The insulating layer 128 may be made from silicon, silicon nitride, silicon oxide or some combination of the two. The pull-up electrode 130, if present, may comprise a metal. In another embodiment, the pull-up electrode 130 may comprise a material selected from the group consisting of titanium, tantalum, titanium nitride, tantalum nitride, copper, aluminum, and combinations thereof. The pull-up electrode 130 may be deposited by well known techniques such as sputtering, electroless plating and electrochemical plating. It is to be understood that the device may be formed without the use of a pull-up electrode 130.

An encapsulating layer 132 is then formed over the third sacrificial layer 126 and, if present, the pull-up electrode 130. The encapsulating layer 130 is used to define the outside boundary of the cavity. In one embodiment, the encapsulating layer 130 may comprise silicon based materials. In another embodiment, the encapsulating layer 132 may comprise silicon oxide, silicon nitride, silicon oxynitride, or combinations thereof. The encapsulating layer 132 may be deposited by well known techniques such as PECVD and CVD. In one embodiment, the encapsulating layer 132 is deposited so that at least a portion of one or more of the first sacrificial layer 112, the second sacrificial layer 118, or the third sacrificial layer 126 extends outside of the encapsulating layer 132. In another embodiment, a hole is etched through the encapsulating layer 132 to expose one or more of the first sacrificial layer 112, the second sacrificial layer 118, or the third sacrificial layer 126. The hole through the top may be positioned so that it is over the base ends of the double clamped cantilever, so that when the hole is sealed the material sealing the hole comes down through the hole to provide increased mechanical support for the ends of the cantilever.

An etchant is then introduced through the hole (or exposed to the sacrificial material extending outside of the encapulating layer 132). The etchant selectively etches the first sacrificial layer 112, the second sacrificial layer 118 and the third sacrificial layer 126 to remove the sacrificial material. The first structural layer 116, posts 122 and second structural layer 124 remain within a cavity 132. The cavity 132 may then be sealed by depositing a second encapsulating or sealing layer (not shown). It is advantageous to design the cavity so that the top sacrificial layer is removed before the other sacrificial layers. Having holes come through the top layer 132 above the ends of the MEMS device helps in this process. This is important because if there is a temperature rise during the etch process the cavity top may move. If the sacrificial layer is removed first from above the cantilever device then the lower sacrificial layers hold it in place and the top cavity movement does not cause increased strain on the cantilever. If the bottom sacrificial layer were to etch first then the cantilever device would be stuck to the top of the cavity by the top sacrificial layer and thus movement of the cavity could damage the cantilever device. By curing the lower sacrificial layers for longer they take longer to etch. To prevent unwanted charging of the oxide during the release process it is important to ensure that there are few OH molecules present during the etching. When using plasma etching the ionic etchant ions are produced in a plasma outside the cavity and diffuse in through the cavity holes. Because the cantilever may be a grounded metal, the ionic concentration is then greatly reduced and the etch rate decreases. To solve this problem the conducting metal surface can be coated with a layer of insulator. This can be an insulating layer deposited just after the metal layer is put down. It can be a silicon based material or silicon oxide or silicon nitride or other dielectric material. The cavity may then be sealed by depositing a sealing layer over the hole.

Once the first, second and third sacrificial layers have been removed, the first structural layer 116, posts 122 and second structural layer 124 are movable within the cavity between a position wherein the first structural layer 116 is in contact with the dielectric layer 102 and a position wherein the first structural layer 116 is spaced from the dielectric layer 102. Additionally, if the pull-up electrode 130 is present, the first structural layer 116, posts 122 and second structural layer 124 are movable between a position wherein the second structural layer 124 is in contact with the insulator layer 128 under the pull-up electrode 130 and a position wherein the second structural layer 124 is spaced from the pull-up electrode 128. The final structure shows a waffle-type cantilever structure.

The waffle-type cantilever structure has many advantages. One of the advantages is that the structure provides a way for independent tuning of plate rigidity and suspension springs. The length of the posts 122, the number of posts 122, the thickness of the structural layers 116, 124, and the shape of the structural layers 116, 124 may all be tailored to obtain a rigidity that suits the end user's needs.

Another advantage is that the waffle-type structure enables the creation of compound springs. Placing the compound springs further from the RF electrode results in a reduction of the hot-switch spec. However, the stiffer the waffle-type structure becomes, the less the loss of hot-switch capability is.

Another advantage of the waffle-type structure is that it is a low mass way of increasing stiffness, therefore reducing momentum, travelling time and impact effects and increasing reliability.

Another advantage of the waffle-type structure is that the top and bottom of the membrane can be shaped to improve actuation areas or processing spacing requirements. Additionally, the two depositions for the structural layers 116, 124 can be the same so they have the same stress and thus no differential stress and this also reduces process development efforts. The waffle-type structure can have two sets of bi-layers so that there is no net differential stress. The waffle-type structure reduces deposition time and material use. Additionally, there is an improved RF linearity as the stiffer plate would deflect less with voltages applied on the RF electrode.

The maximum stiffness is defined by the distance between the two layers, as it is required to have good step coverage of the ViaBBs which connect the MetB1 layer and the MetB2 layer as shown in FIG. 2A. FIG. 2B is a top view of FIG. 2A.

The electrostatic force for a parallel plate system can be described by the equation, $$F = \frac{\varepsilon_0 A V^2}{2g^2},$$

where 'F' is the electrostatic force, '$\in_o$' is the permittivity of a vacuum, 'A' is the area of interaction, 'V' is the voltage difference and 'g' is the distance between the electrostatic plates.

If we consider the application of a MEMS cantilever as one of the plates of a variable capacitor, then one of the desired attributes is a large capacitance ratio. The capacitance is a function of the inverse of the distance between the two plates '1/g', and therefore to obtain a larger ratio, it is required to have a large change in gap. To get the large gap will require an increase in the pull-in force (derived from the electrostatic force equation).

In order to avoid charging of a dielectric layer placed over the pull-in electrodes (to prevent shorting when the plate touches the pull-in electrode), low actuation voltages should be used, and the area of the pull-in electrodes should be limited to make a device with a reasonable capacitance density. As the degrees of freedom to change the electrostatic force are limited by RF performance (a large gap is required to obtain the tuning ratio), the only way to reduce the actuation voltage is to reduce the mechanical stiffness involved in the pull-down process.

Flexible supporting springs can be used to obtain low actuation voltages in an electrostatically actuated device. However, if the plate is built using the same layer as the support beams, the stiffness of the plate would also be low, and as a consequence the hot-switch voltage would be lower than the actuation voltage.

To have a higher hot-switch voltage, a compound spring can be added, and to increase the efficiency of the compound spring, a stiff plate may be used. The stiffness of the digital variable capacitor plate between the compound springs can be approximated by a simply supported plate with uniformly distributed load, which is given by the equation:

$$R = \frac{\alpha * E * t^2}{L^4},$$

where 'α' is a constant, 'E' is the young's modulus given by the material used, 't' is the thickness of the plate, and 'L' is the distance between the supports. This equation shows that if the distance between the supports (compound springs) is large, the stiffness of the plate becomes very small (1/L^4), which would make the hot-switch voltage small.

As the distance between the compound springs is given by the width of the RF electrode (one cannot put compound springs on top of the RF line because the capacitance ratio then goes down) increasing the thickness of the structure is how a stiffer structure can be obtained. This is where the waffle structure shown in FIGS. 2A and 2B becomes of interest.

The waffle-structure of FIGS. 2A and 2B could be built using the following process starting with the MetB1 layer (excluding the anchor and whatever is below the MetB1). First, layer MetB1 may be deposited, patterned and etched on a sacrificial layer anchored to the substrate contact. Then, a sacrificial material is deposited or spin coated onto MetB1. Openings (ViaBB) may be formed in the sacrificial material. Then, the MetB2 layer may be deposited, patterned and etched. The MetB2 will deposit within the ViaBBs. A top sacrificial layer may then be deposited or spin deposited onto the MetB2 and patterned. One or more cavity cap layers may then be deposited. One or more openings may be etched into the cavity to permit introduction of etching gas/solution to the sacrificial layers. The etching gases/solution may be introduced through the openings to etch/remove the sacrificial layers and release the waffle structure. The cavity may then be sealed.

The support springs will then be defined in MetB1 which can be thin, and therefore, the pull-down voltage would be low. The compound springs (not shown in the picture) would be at either side of the RF electrode, and the stiffness of the plate between the compound springs would be increased due to the thickness added using the MetB2 after the spacer.

The stiffness of the waffle structure is not the same as having a film with the thickness of MetB1+ViaBB+MetB2. However the method can be used to increase the stiffness without using very thick metal layers, which are difficult to etch and to control the stress during deposition.

Figure 3C:
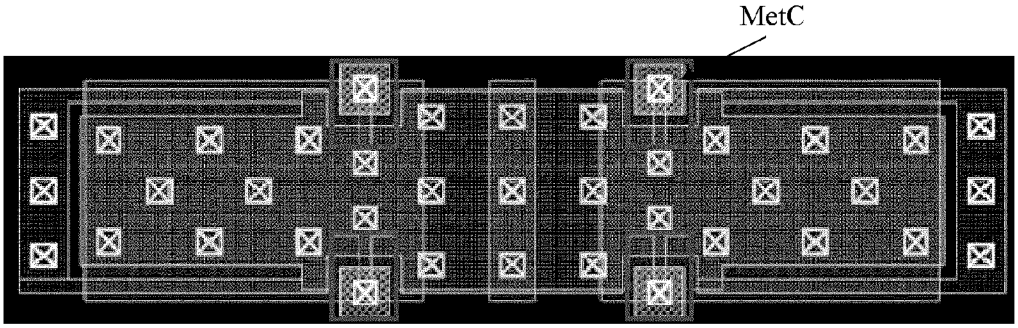

FIGS. 3A-3F show waffle-type MEMS devices that utilize compound spring technology. As shown in FIG. 3A, MetA is used to route and create control and RF electrodes. MetC can be electrically connected or not electrically connected to MetA and is used to strengthen and to create a stopper where the MetB1 can contact as explained below. MetB1 and MetB2 are the switch itself. It is possible to have compound spring legs in both layers. For example, the ones in MetB1 can land on a MetC stopper, and the ones in MetB2 can land on a solid MetB1 piece. The compound spring is a piece of material that comes out from the main plate and lands on a metal (could also be other material) that is located at a different level.

As shown in FIG. 3B, the MetB1 legs land on a MetC stopper. In this case, the distance between the leg and the stopper is set by the sacrificial layer thickness (maximum negative vertical displacement of the switch) and the thickness of MetC. Assuming the plate does not bend, the geometry (length, width and thickness), material, and the height of MetC define the hot-switch voltage of the switch for a given force created by the RF electrode. In reality, the plate bends, and some of the force available in the compound spring technology is not used for the hot-switching. The closer the compound spring is to the RF line, the more efficiently the force can be used to hot-switch the voltage in the RF electrode.

On the other hand, to obtain for RF capacitors it is desired to be flat at the RF electrode at the maximum capacitance to avoid IP3 inter-modulation issues. This requires that a piece of electrode (see marked as 'y' in FIG. 3B) is available in the inner side towards the RF line. The section shown as 'z' in FIG. 3B is also required to reduce parasitic coupling. The larger the gap, the better the parasitic decoupling; however hot-switch capabilities are lost.

The same principle can be used by making a MetB2 leg land on a MetC+MetB1 stack as shown in FIG. 3C. FIG. 3C shows a switch with compound springs in MetB2 landing on a solid MetC–MetB1 stack.

Figure 3D:
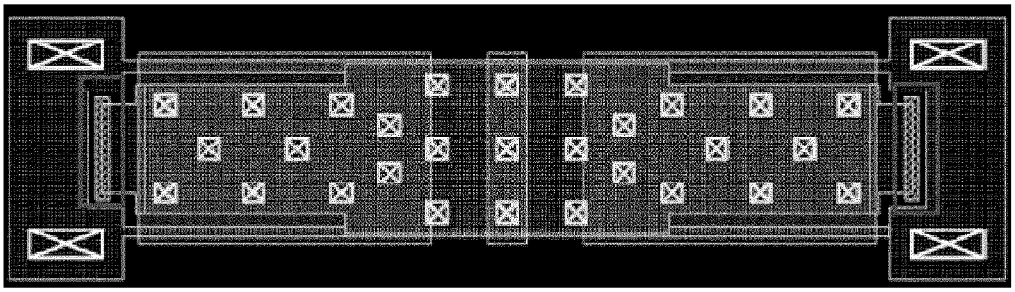
Figure 3E:
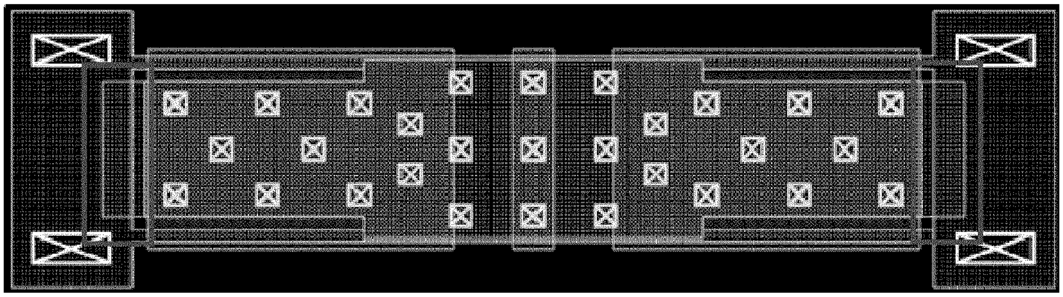

The plate bending devices do not make use of the compound spring technology legs, and instead the tips of the plate land on MetB1 or MetC stoppers, having similar effects as described in previous sections. Having the contact at the end of the plate reduces the efficiency for the hot-switch; however, it is a good method to reduce the contact area between the control electrode and the plate, and therefore reduce the stuck failures. FIG. 3D shows a device using the plate bending technique with the MetB1 of the plate landing on a MetC stopper near the plate-anchors. In the same way, the plate bending technique can be used by landing the MetB2 of the plate on a MetB1 bridge near the plate-anchors as shown in FIG. 3E.

Figure 3F:
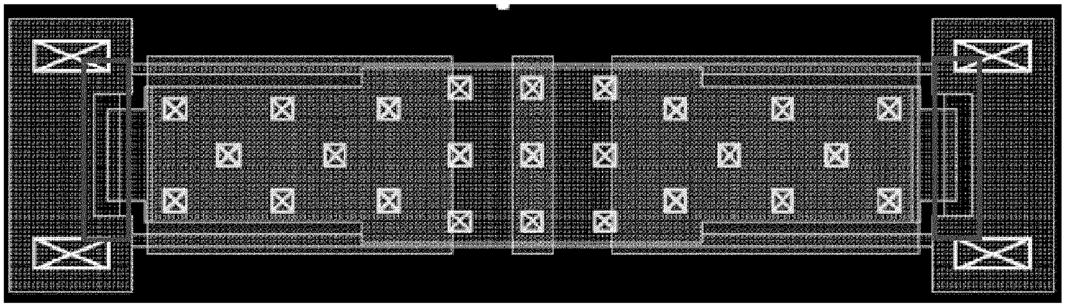

Stoppers to the top may also be added to avoid stiction to the roof. This has been achieved using a plate bending configuration where the MetB1 section at the end of the plate makes contact with a MetB2 piece that comes from the anchor. In this case the engagement range is defined by the thickness difference between the sacrificial layers, MetB1-MetB2 and MetB2-Roof. FIG. 3F shows a possible configuration. In FIG. 3F MetB1 stops on a MetB2 stopper before it hits the roof, and forces the plate to bend, reducing contact area between the plate and the roof electrode.

It is possible to combine compound spring technology legs with plate bending options in order to obtain a large hot-switch voltage and also a reduced contact area to avoid failure of the device due to stiction or oxide charging. Making use of sacrificial thicknesses, it is possible to create multi-stage compound springs, where a MetB2 leg could land on MetB1 (solid block or switch leg) and a little further in the pull process the MetB1 could land on an MetC stopper, creating a non-linear spring with three linear sections. This number of linear sections could be extended if required.

This invention relates to MEMS switches and in particular to RF MEMS switches where the MEMS cantilever acts as one arm of a capacitance switch which comes close to an RF electrode under the MEMS switch in the high capacitance state, and is pulled away from the RF electrode in the low capacitance state. A second electrode under the MEMS switch is used to pull the cantilever down. If the RF signal is large this AC voltage on the electrode will be faster than the resonant frequency of the MEMS cantilever, but it will still provide an average pull-in force because it is the difference in voltage between the MEMS cantilever and the RF electrode that causes and attractive force. Therefore the cantilever will experience a pulse of attractive force when the RF voltage goes negative and another one when it goes positive. To allow larger RF voltages being used we propose adding an extra pull up electrode above the MEMS cantilever. This can be actuated to move the MEMS cantilever further from the pull down electrode and it also provides a large holding force which prevents the cantilever being pulled in by high RF fields sustaining much higher RF voltages. This would also work if the device was being operated as a DC switch with the RF electrode being replaced by a DC voltage line. In the above example the MEMS cantilever is assumed to be at DC ground potential.

The problem is that many MEMS devices have three terminals with an actuation voltage being applied to a pull-in electrode to bring a MEMS moving part into contact with a third landing electrode. If the landing electrode also has a voltage signal applied to it, there will be an attractive force between that electrode and the cantilever. In the example below, the MEMS cantilever touches down on a thin oxide layer above the landing electrode which is a radio frequency line. Therefore there is an increase in capacitance coupling between the MEMS cantilever and the RF landing electrode as the MEMS cantilever gets closer to the thin insulating layer above the RF electrode. The pull-in electrode on the same side of the MEMS switch is used to alter the Cantilever position and thus the capacitance coupling of the RF line to the DC grounded cantilever. A large voltage signal applied to the RF electrode can cause self actuation of the MEMS device. This could pull the MEMS cantilever down and thus alter the capacitance without a voltage being applied to the pull-in electrode. Previously this problem was solved by making the MEMS cantilever stiffer so that it would not self actuate from large signals on the landing RF electrode. The problem with this is that this means that a larger force is then required to switch the device using the actuation electrode. This can be achieved by increasing the area of the pull-in electrode with the MEMS cantilever, which has the drawback of increasing the devices size and introducing larger unwanted stray capacitance between the RF electrode and the pull-in electrode. Alternatively, the voltage can be increased on the pull-in electrode, which has the problem of charge leakage into nearby insulators and a reduction in lifetime, as well as increased cost of providing charge pumps.

A pull up electrode may be used which moves the MEMS cantilever further away from the RF electrode. The pull-in force is approximately proportional to the square of the electric field. Therefore doubling the spacing will increase the self actuation voltage by a factor of four. In addition, with the cantilever pulled to the top, the cantilever is much closer to the top and so the electrostatic force from the top is greatly increased. If there is an insulator of thickness t with relative permittivity $\in_r$ between the pull-up electrode and the MEMS cantilever when it is in the up state and the MEMS cantilever is now 2d away from the RF electrode, then a voltage $V_{top}$ on the top would provide an electrostatic pull-up force greater than a voltage $V_{RF}$ if $$\frac{A_{top}\cdot V_{top}^2}{\left(\frac{t}{\varepsilon_r}\right)^2} > \frac{A_{RF}\cdot V_{RF}^2}{(2d)^2}.$$

If t=d/2 and $\in_r$=4 then $V_{RF}$ would need to be 16 times $V_{top}$ to pull the cantilever back down if $A_{top}=A_{RF}$. However, in most cases the pull up area $A_{top}$ is also greater than that of the RF landing electrode $A_{RF}$ adding extra effectiveness to the top voltage pull.

This technique is particularly relevant to a DVC consisting of an array of MEMS capacitors that are programmed to be either touching the cavity roof (pull up electrode with insulator under it), which is the low capacitance state, or touching down on the thin insulator over the RF electrode, which is the high capacitance state. The desired capacitance is achieved by configuring the appropriate number of MEMS switches to either be in up or down state. Thus, only one voltage need be applied to hold each cantilever up and another is required to hold it down. When trying to keep each MEMS cantilever at an intermediate given height in between being pulled to the top or the bottom RF electrode, then the pull-up voltage would have to be continually adjusted to counteract changes of power in the pull down electrode. This would require complicated fast feedback related to the instantaneous RF power.

A pull-up electrode may be present to move a cantilever within a cavity. The advantage of adding the pull-up electrode is that for the same design of a device, the self actuation voltage can be greatly increased. Self actuation is the voltage at which a signal on the RF line causes the MEMS switch to actuate in an unwanted manner. It allows a smaller and lower voltage device to be made which has the same self actuation voltage as a device without a pull up electrode.

Of great relevance is also the improved linearity performance of the MEMS switch. The RF self actuation is the main cause of non-linearity in the case of an electrostatically actuated MEMS switch or variable capacitor. The variations of instantaneous RF power generate a time-varying non-linear capacitance between the RF electrode and the MEMS cantilever electrode. The amount of capacitance variation for a given RF power range is greatly reduced by actively pulling the MEMS cantilever to the top. The resulting intermodulation distortion due to the non-linear capacitance is greatly reduced. There needs to be a separate contact to a top pull up electrode. The control circuitry needs to generate two control voltages in order to operate the MEMS switch device.

Figure 4A:
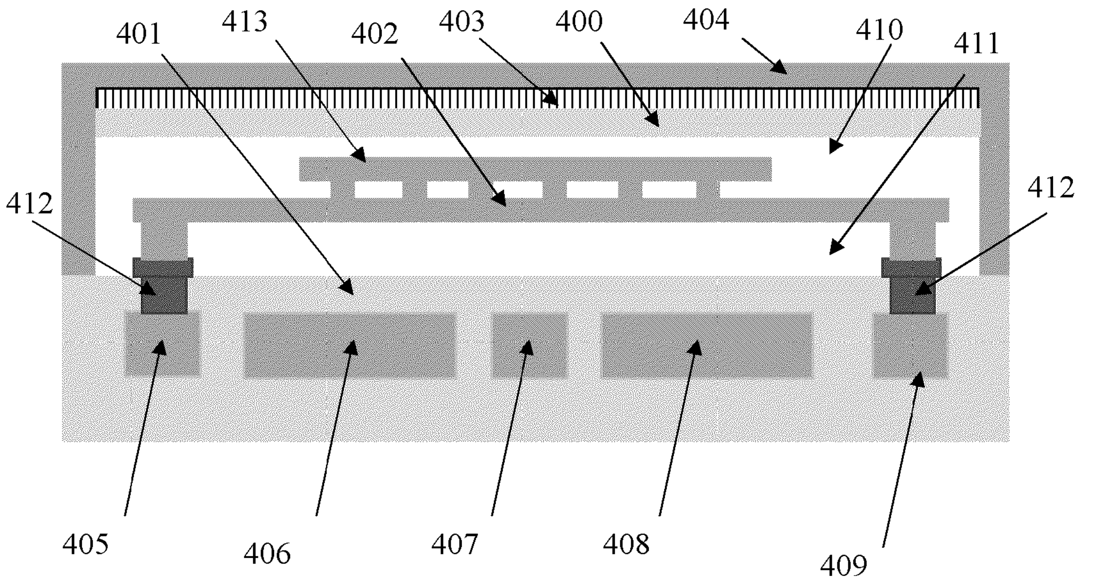
FIGS. 4A-4C show the movement of a MEMS device according to one embodiment.
Figure 4B:
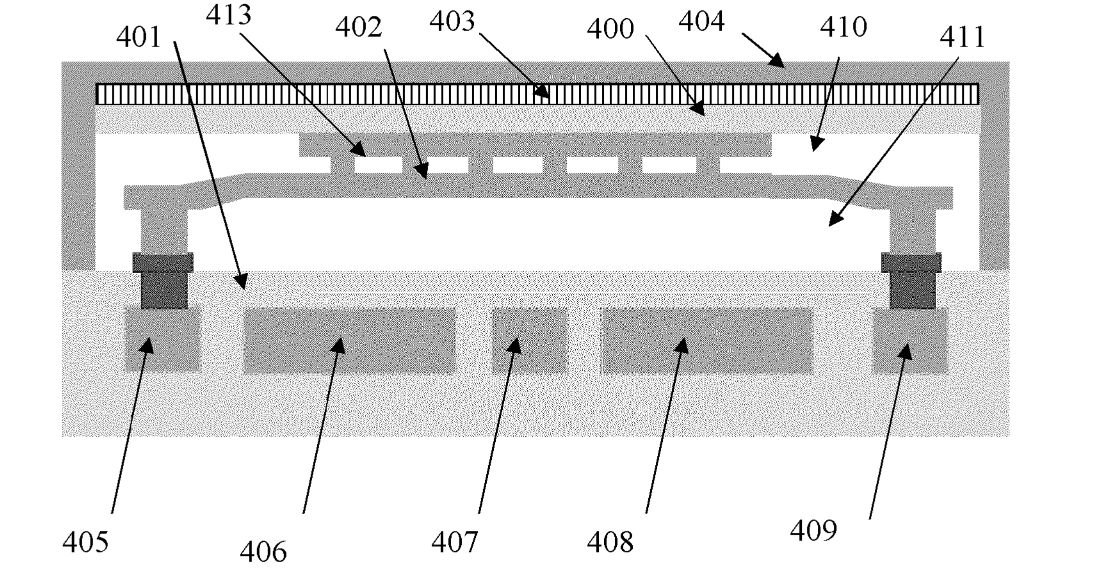
Figure 4C:
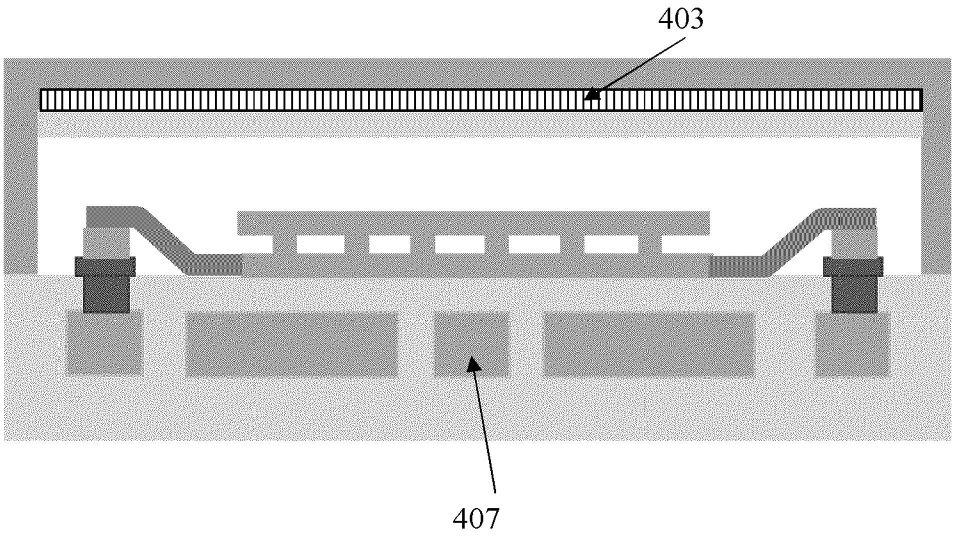

In FIGS. 4A-4C, the use of the pull up electrode in relation to a DVC where there is an array of MEMS cantilever bridges that have two possible capacitance states, either pulled down (high capacitance state) or pulled up (low capacitance state) is shown. However the same advantage would be gained if the MEMS cantilever was to be used as a switch which is either down (on) or up (off). The pull up electrode would then prevent large signals on the landing electrode pulling down the MEMS cantilever to make electrical contact to the down electrode.

In FIGS. 4A-4C, layer 401 is an insulating layer formed over the metallization track 405, 409, RF line 407, and pull-in electrodes 406, 408. The cantilever 402 is formed over the insulating layer 401. In one embodiment, the cantilever 402 may comprise a conductive material. In another embodiment, the cantilever 402 may comprise titanium nitride. Another insulating layer 400 may be present to cover the pull-up electrode 403. In one embodiment, insulating layer 400 may comprise silicon dioxide, silicon nitride, or combinations thereof. The metallization track 405, 409 make contact to the cantilever 402. The regions 410 and 411 are the cavity space. These regions 410, 411 previously contained a sacrificial layer which is removed out of the cavity during a release etch process. Layer 412 is a via through insulating layer 401 to allow the cantilever 402 to connect to the metallization track 409.

The devices can be made by initially depositing the metal tracks 405, 406, 407, 408 and 409 on an insulating substrate. A second insulating layer is deposited on top of these tracks. A chemical mechanical polishing process may be performed to planarize back to the metal tracks 405 to 409. A third thin insulating layer 401 is deposited. Insulating layer 401 covers the electrodes. Vias 412 are made through the insulating layer 401 using optical lithography followed by etching to open the holes, then metal deposition, a further lithography stage and etching to leave the vias as shown. A sacrificial layer is then spun-on which could be a silicon free spin-on material that is then patterned to create the region 411 which will eventually be the cavity under the MEMS cantilever to allow the cantilever section 402 to connect to the vias 412. The cantilever 402 may be designed to have a waffle like stiffening region in the middle (layer 413). This is made by spinning on a sacrificial layer on to the cantilever layer 403, etching via holes through it and then adding a second cantilever layer (could be TiN on top) creating via connections to the cantilever layer 402. A final sacrificial layer is spun-on top of the cantilever and stiffening structure to create the cavity 410. A hole is etched through the top or side of layer 403, 400 and 404 to allow etch gasses to remove all the sacrificial layers. These holes are then sealed in the same machine that etches the sacrificial layer so that the cavity can be sealed in a low pressure state. With an organic spin-on material the etchants may be reactive oxygen or hydrogen radicals. It is important to minimize the quantity of OH groups within the etch process, because they can lead to charging of the oxide which leads to unwanted actuation of the device during release.

In FIG. 4B, electrode 403 is used to pull cantilever 402 to touch insulating layer 400. Electrode 403 holds cantilever 402 so that it can not be pulled down onto RF electrode 407 when there is a high power signal applied to it. FIG. 4C shows the cantilever 402 pulled down by applying voltages to electrodes 406 and 408 while turning off the pull-up voltage on electrode 403. This pulls the cantilever down onto the insulator 401 above electrode 407. In both FIGS. 4B and 4C, the cantilever 402 is spaced from the electrodes by an insulating layer. FIGS. 4B and 4C show one of the digital capacitors that can implement the DVC in the two capacitance states, either low capacitance pulled up to the insulating layer 403 under the pull-up electrode 404, or in the high capacitance state, pulled down onto the insulating layer 401 over the RF electrode 407.

If the insulating layer 400 is of thickness t between the pull-up electrode 403 and the MEMS cantilever 413 when it is in the up state and the MEMS cantilever is 2 d away from the RF electrode, then a voltage $V_{top}$ to the pull-up electrode 403 would provide an electrostatic pull-up force greater than a voltage $V_{RF}$ if $$\frac{A_{top}\cdot V_{top}^2}{\left(\frac{t}{\varepsilon_r}\right)^2} > \frac{A_{RF}\cdot V_{RF}^2}{(2d)^2}.$$

(where ∈r is the relative dielectric for the top oxide which will be greater than 1). If t=d/2 then $V_{RF}$ would need to be at least 16 times $V_{top}$ to pull the cantilever back down if $A_{top}=A_{RF}$. In most cases the pull up area is also greater as it covers the whole roof of the cavity and so covers most of the MEMS cantilever, in which case the RF-voltage required to pull the cantilever back down would be increased even further. Thus, the pull-up electrode 403 may help improve the performance of the DVC.

Figure 5A:
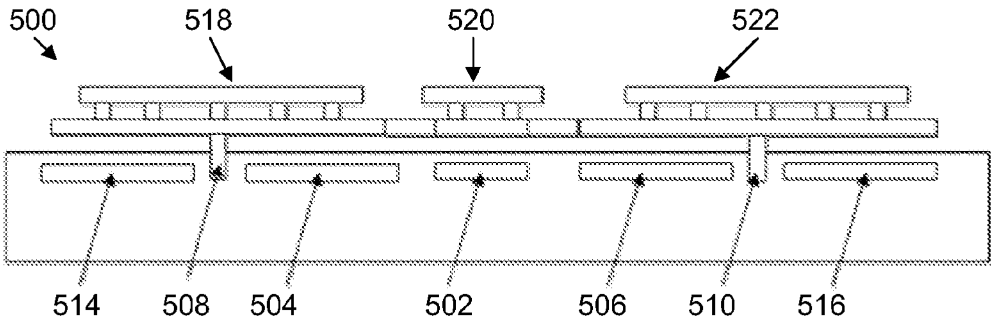
FIGS. 5A-5C are schematic illustrations of a MEMS device according to another embodiment.
Figure 5B:
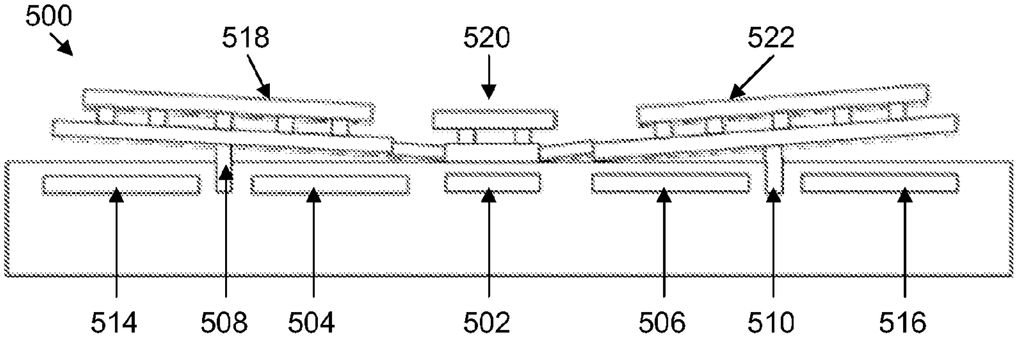
Figure 5C:
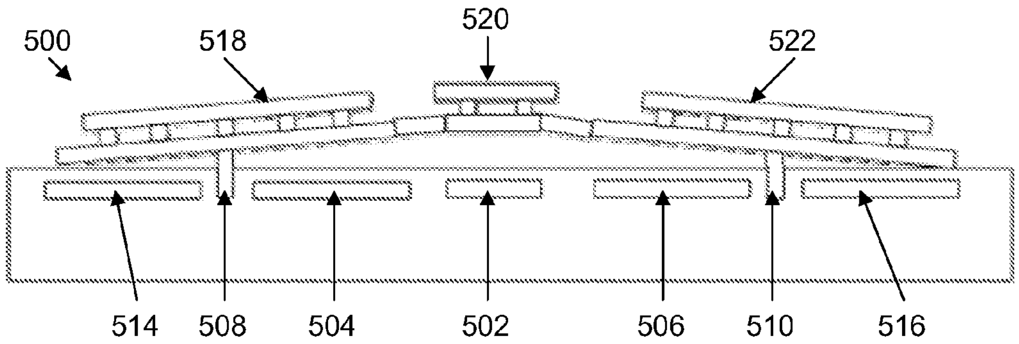

FIGS. 5A-5C are schematic illustrations of a MEMS device 500 according to another embodiment. The MEMS device includes an RF electrode 502, electrodes 504, 506 that are used to pull in the cantilever such that the center portion 520 is brought in close proximity to the RF electrode 502, pivot points 508, 510, electrodes 514, 516 that are used to pull the MEMS cantilever central portion 520 away from the RF electrode 502, and two cantilever end portions 518, 522 that pivot on pivot points 508, 510 respectively.

As shown in FIG. 5A, the cantilever structure includes end portions 518, 522 as well as a central portion 520. The central portion 520 moves from a position that is in close proximity to the RF electrode 502 (shown in FIG. 5B) and a position that is spaced far away from the RF electrode 502 (shown in FIG. 5C). When the central portion 520 is spaced in close proximity to the RF electrode 502, a portion of the end electrodes 518, 522 are pulled into close proximity to electrodes 504, 506. However, when the central portion 520 is spaced far away from the RF electrode 502, opposite ends of the end electrodes 518, 522 are in close proximity to electrodes 514, 516. The cantilever portions are only in close proximity rather than direct contact with the electrodes due to the presence of an insulating layer over the electrodes.

In operation, the MEMS device 500 operates as follows. The central portion 520 may be spaced from RF electrode 502 while the end portions 518, 522 may be spaced from electrodes 504, 506, 514, 516 as shown in FIG. 5A.

Thereafter, an electrical bias is applied to one or both of electrodes 504, 506 and the central portion 520 is pulled into close proximity of RF electrode 502 as shown in FIG. 5B. In so moving, the end portions 518, 522 pivot on pivot points 508, 510 such that a portion of the end portions 518, 522 are placed into close proximity of electrodes 504, 506. During this time, electrodes 514, 516 may be either at ground or floating potential.

Thereafter, to move the central portion 520 from being in close proximity to the RF electrode 502, the central portion 520 may be pulled-off as shown in FIG. 5C. To pull-off the central portion 520, bias to electrodes 504, 506 is removed such that electrodes 504, 506 are either floating, grounded, or even at the opposite potential from which bias was applied to pull the central portion 520 into close proximity of RF electrode 502. A bias may be applied to electrodes 514, 516 such that the end portions 518, 522 pivot about pivot points 508, 510 and pull-off the central portion 520 and move the central portion 520 to a position far away from RF electrode 502. In so moving, the opposite ends of the end portions 518, 522 are positioned in close proximity to electrodes 514, 516.

It is to be understood that while the electrodes disclosed herein have been referred to as "pull-up" electrodes, the electrodes need not necessarily need to be physically located above the cantilever structure. Rather, the "pull-up" electrodes may simply be pull-off electrodes that operate to pull the cantilever electrode from one position to another position. Thus, in all of the descriptions herein, the term "pull-up" encompasses not only electrodes that are physically located above the cantilever structure, but more broadly, electrodes that operate to pull off the cantilever structure. It is also to be understood that while the embodiments discussed herein have referred to utilizing titanium nitride as the materials for the cantilever structures, titanium-aluminum alloy or titanium aluminum nitride ($Ti_xAl_yN_z$ where x, y and z indicate the proportion of each element in the alloy) is also contemplated to be utilized in place of titanium nitride. It is also contemplated that titanium nitride and titanium-aluminum alloy may be utilized together in a multi-layer structure such as a three layer stack of titanium nitride, aluminum, titanium nitride.

Pulling to the top can create stiction at the top side, which may be overcome by utilizing CST as discussed above. Alternatively, the stiction could be addressed by shaping the top electrode, and reducing the electrical field and pressure in strategic locations, for example adding bumps where electrostatic force is not applied.

By forming a cantilever with a waffle-type microstructure, a MEMS device may be designed for independent tuning of the cantilever rigidity. A cantilever so designed may be more reliable. Additionally, applying a voltage to a pull-up electrode may aid in overcoming stiction when the cantilever is pulled close to a lower RF line.

While the foregoing is directed to embodiments of the present invention, other and further embodiments of the invention may be devised without departing from the basic scope thereof, and the scope thereof is determined by the claims that follow.

The invention claimed is:

1. A micro-electromechanical device, comprising:

a first structural layer coupled to a plurality of first electrodes;

a second structural layer spaced from the first structural layer to define a space between the first structural layer and the second structural layer, wherein the second structural layer has a length less than a length of the first structural layer;

a plurality of posts disposed within the space and coupled between the first structural layer and the second structural layer, the first structural layer, the second structural layer and the plurality of posts forming a waffle pattern; and one or more electrically conductive compound springs spaced from the first structural layer, the second structural layer and the plurality of posts and disposed within a cavity, wherein the one or more electrically conductive compound springs are adjacent a RF electrode.

2. The micro-electromechanical device of claim 1, wherein the first structural layer is spaced from one or more second electrodes.

3. The micro-electromechanical device of claim 2, further comprising:

a dielectric layer; and the one or more second electrodes embedded within the dielectric layer, wherein the one or more second electrodes are embedded within the dielectric layer and wherein the first structural layer, the second structural layer and the plurality of posts are collectively movable between a position in which the first structural layer is in contact with the dielectric layer and a position in which the first structural layer is spaced from the dielectric layer.

4. The micro-electromechanical device of claim 3, wherein the first structural layer, the second structural layer and the plurality of posts are disposed within a cavity having a roof spaced from the second structural layer, the device further comprising:

one or more third electrodes coupled to the roof and spaced from the second structural layer and wherein the first structural layer, the second structural layer and the plurality of posts are collectively movable between a position in which the second structural layer is in contact with the one or more third electrodes and a position in which the second structural layer is spaced from the one or more third electrodes.

5. The micro-electromechanical device of claim 1, wherein the first structural layer, the second structural layer and the plurality of posts are disposed within a cavity having a roof spaced from the second structural layer.

6. The micro-electromechanical device of claim 5, wherein the first structural layer, the second structural layer and the plurality of posts are movable within the cavity.

7. A micro-electromechanical device, comprising:

a first structural layer coupled to one or more first electrodes;

a second structural layer spaced from the first structural layer to define a space between the first structural layer and the second structural layer, wherein the second structural layer has a length less than a length of the first structural layer;

a plurality of posts disposed within the space and coupled between the first structural layer and the second structural layer, each of the plurality posts spaced from an adjacent post, the first structural layer, second structural layer, and plurality of posts collectively forming a cantilever that is disposed within a cavity; and one or more electrically conductive compound springs spaced from the cantilever and disposed within the cavity.

8. The device of claim 7, wherein the first structural layer is spaced from one or more second electrodes.

9. The micro-electromechanical device of claim 8, further comprising:

a dielectric layer; and the one or more second electrodes embedded within the dielectric layer, wherein the one or more second electrodes are embedded within the dielectric layer and wherein the first structural layer, the second structural layer and the plurality of posts are collectively movable between a position in which the first structural layer is in contact with the dielectric layer and a position in which the first structural layer is spaced from the dielectric layer.

10. The micro-electromechanical device of claim 9, wherein the first structural layer, the second structural layer and the plurality of posts are disposed within a cavity having a roof spaced from the second structural layer, the device further comprising:

one or more third electrodes coupled to the roof and spaced from the second structural layer and wherein the first structural layer, the second structural layer and the plurality of posts are collectively movable between a position in which the second structural layer is in contact with the one or more third electrodes and a position in which the second structural layer is spaced from the one or more third electrodes.

11. The device of claim 7, wherein the first structural layer is movable from a position spaced from the one or more electrically conductive compound springs and a position in contact with the one or more electrically conductive springs.

12. The device of claim 11, wherein the one or more electrically conductive springs are movable from a position spaced from a dielectric layer and a position in contact with the dielectric layer.

* * * * *